United States Patent
Ho et al.

(10) Patent No.: US 10,175,731 B2
(45) Date of Patent: Jan. 8, 2019

(54) SHARED COOLING FOR THERMALLY CONNECTED COMPONENTS IN ELECTRONIC DEVICES

(71) Applicant: Microsoft Technology Licensing, LLC, Redmond, WA (US)

(72) Inventors: Chau Van Ho, DesMoines, WA (US); Bo Dan, Redmond, WA (US); Spencer Eggert, Redmond, WA (US); Greg Nielsen, Kirkland, WA (US); Matthew Gen, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 62 days.

(21) Appl. No.: 15/186,423

(22) Filed: Jun. 17, 2016

(65) Prior Publication Data
US 2017/0364130 A1    Dec. 21, 2017

(51) Int. Cl.
*G06F 1/20*    (2006.01)
*H05K 7/20*    (2006.01)
*G06F 1/32*    (2006.01)

(52) U.S. Cl.
CPC ............ *G06F 1/206* (2013.01); *G06F 1/3206* (2013.01); *G06F 1/3296* (2013.01); *H05K 7/20336* (2013.01)

(58) Field of Classification Search
CPC .......... G06F 1/206; G06F 1/324; G06F 1/203; G06F 1/3203; G06F 1/3296;
(Continued)

(56) References Cited

U.S. PATENT DOCUMENTS

| | | | |
|---|---|---|---|
| 7,085,945 B2 * | 8/2006 | Silverster ................. | G06F 1/206 713/320 |
| 7,461,272 B2 * | 12/2008 | Rotem ............... | G05D 23/1934 700/299 |

(Continued)

OTHER PUBLICATIONS

Zhao, Michael, "Liquid-Cooled Laptops Can Handle Overclocked Processors Without Overcooking Thighs", published on: Mar. 24, 2012 Available at: http://gizmodo.com/5896149/liquid-cooled-laptops-can-handle-overclocked-processors-without-overcooking-thighs.
(Continued)

*Primary Examiner* — Jaweed A Abbaszadeh
*Assistant Examiner* — Brian J Corcoran
(74) *Attorney, Agent, or Firm* — Ray Quinney & Nebeker P.C.; Paul N. Taylor

(57) ABSTRACT

Cooling of at least two heat generating electronic components of a computing device is described herein. The computing device includes the at least two heat generating electronic components. The at least two heat generating electronic components includes a first heat generating electronic component and a second heat generating electronic component. The first heat generating electronic component and the second heat generating electronic component are in thermal communication. The computing device also includes a first sensor operable to measure a first temperature. The first temperature is associated with the first heat generating electronic component. The first heat generating electronic component, the second heat generating electronic component, another heat generating electronic component of the at least two heating generating electronic components, or any combination thereof is configured to compare the first measured temperature to a predetermined temperature, and decrease a power for the second heat generating electronic component based on the comparison.

18 Claims, 4 Drawing Sheets

(58) Field of Classification Search
CPC .............. G06F 11/3031; G06F 11/3037; G06F 11/3058; G06F 1/3287; G06F 1/1626; G06F 1/1632; G06F 1/1656; G06F 1/20; G06F 1/3206; G06F 2200/201; H01L 23/427; H01L 23/467; H01L 33/648
See application file for complete search history.

(56) References Cited

U.S. PATENT DOCUMENTS

| | | | |
|---|---|---|---|
| 7,630,856 B2 | 12/2009 | Rockenfeller et al. | |
| 8,798,806 B2 | 8/2014 | Lev et al. | |
| 8,942,857 B2 | 1/2015 | Anderson et al. | |
| 8,970,562 B2 * | 3/2015 | Xu | G06F 1/206 345/101 |
| 8,972,759 B2 | 3/2015 | Doshi et al. | |
| 9,342,135 B2 * | 5/2016 | Brackman | G06F 1/206 |
| 9,530,174 B2 * | 12/2016 | Vaishampayan | G06F 1/206 |
| 2004/0128100 A1 * | 7/2004 | Rotem | G01K 7/42 702/136 |
| 2006/0261470 A1 | 11/2006 | Schick | |
| 2009/0002937 A1 * | 1/2009 | Liu | G06F 1/20 361/679.47 |
| 2009/0021908 A1 * | 1/2009 | Patel | G06F 1/20 361/688 |
| 2010/0175851 A1 | 7/2010 | Heydari et al. | |
| 2012/0311357 A1 | 12/2012 | Andrews | |
| 2012/0323400 A1 | 12/2012 | Sankar et al. | |
| 2013/0305067 A1 * | 11/2013 | Lefurgy | G06F 9/4893 713/320 |
| 2014/0006818 A1 | 1/2014 | Doshi et al. | |
| 2014/0185241 A1 | 7/2014 | Macdonald | |
| 2014/0249690 A1 | 9/2014 | Park | |
| 2015/0062802 A1 * | 3/2015 | Grunow | H01L 23/34 361/679.47 |
| 2015/0130821 A1 * | 5/2015 | Shah | G06F 1/3206 345/520 |
| 2015/0253823 A1 | 9/2015 | Han | |
| 2016/0021791 A1 * | 1/2016 | Bosak | F28D 15/0275 165/104.21 |

OTHER PUBLICATIONS

Lin, et al., "An experimental study on applying miniature loop heat pipes for laptop PC cooling", In Proceedings of 29th Annual IEEE Semiconductor Thermal Measurement and Management Symposium, Mar. 17, 2013, pp. 154-158.

Geng, et al., "A self-adaptive thermal switch array for rapid temperature stabilization under various thermal power inputs", In Journal of Micromechanics and Microengineering, Jul. 11, 2011, pp. 1-9.

* cited by examiner

SHARED COOLING FOR THERMALLY CONNECTED COMPONENTS IN ELECTRONIC DEVICES

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
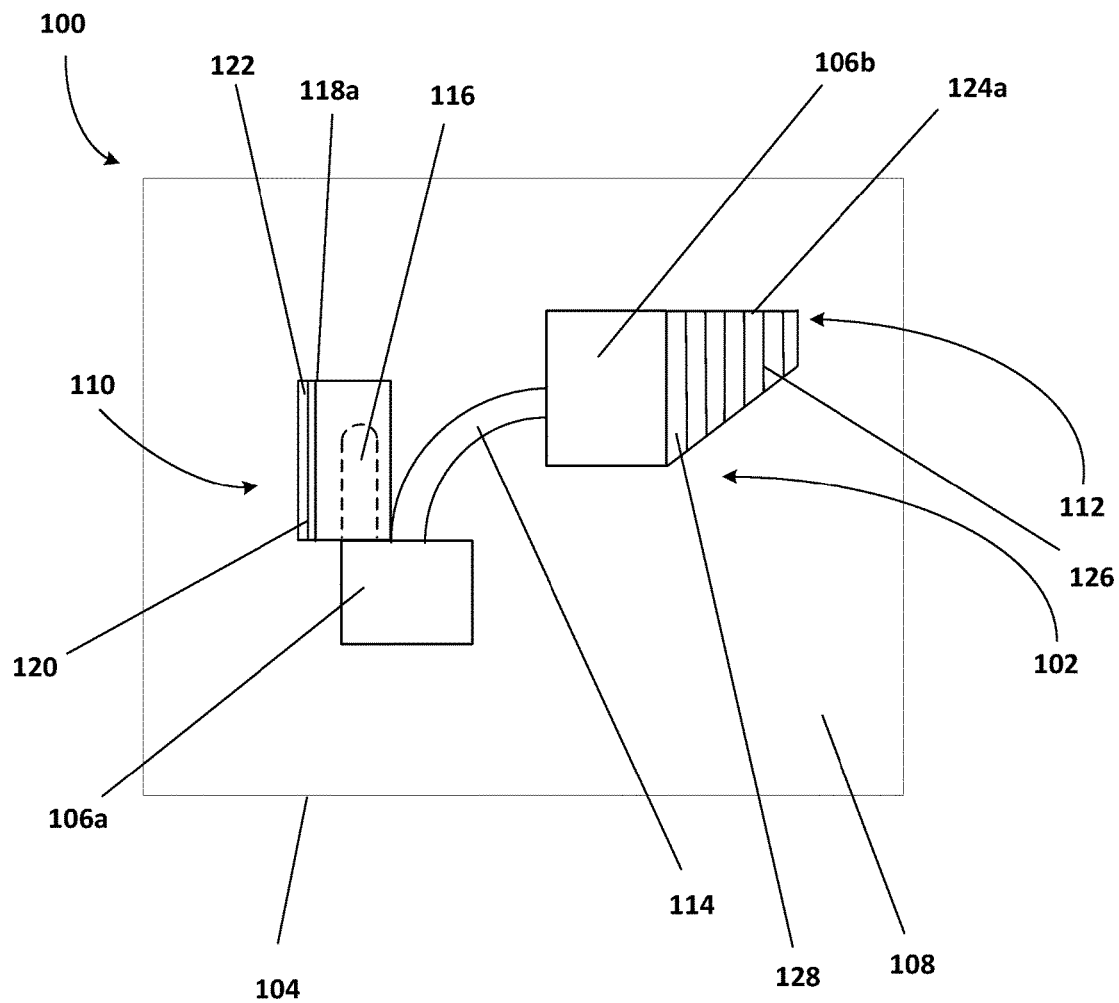
FIG. 1 depicts a top view of a computing device including an example of a shared thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. For forced convection, a computing device may include a number of fans used to move air through the computing device and cool one or more heat generating components of the computing device.

A thermal management system of the prior art may use sensors to track temperatures within the computing device (e.g., corresponding to components within the computing device). The thermal management system includes a respective thermal management solution (e.g., one or more corresponding thermal management devices) for each of the components. Each thermal management solution is configured to handle a worst case workload for each component. For example, a first thermal management solution cools a first component within the computing device (e.g., a central processing unit (CPU)), and a second thermal management solution cools a second component within the computing device (e.g., a graphics processing unit (GPU)). The first thermal management solution is designed to cool, for example, a maximum of 50 W dissipated by the first component, and the second thermal management solution is designed to cool, for example, a maximum of 100 W dissipated by the second component. The first thermal solution and the second thermal solution, combined, are capable of supporting the first component and the second component with a maximum thermal design power (TDP) of, for example, 150 W.

The first component and the second component, however, operate together at the maximum TDP infrequently. A thermal management system designed to separately handle the worst case scenarios for the first component and the second component, respectively, is over-designed. Such an over-designed thermal management system with frequently unused cooling capacity is not cost or space optimized.

Disclosed herein are apparatuses, systems, and methods for sharing cooling between multiple heat generating components within a computing device. Components within the computing device that generate the most heat (e.g., the CPU and the GPU) during operation of the computing device are identified. Thermal solutions (e.g., each including one or more thermal management devices) are designed for these components with shared workloads considered. At least one phase change device thermally links the components that generate the most heat. For example, a heat pipe physically connects and thermally links the CPU and the GPU of the computing device. According to the thermal equilibrium principle, with the CPU and the GPU linked with the heat pipe, for example, the thermal management solution for the CPU cools not only the CPU, but also cools the GPU, and the thermal management solution for the GPU cools not only the GPU, but also cools the CPU.

For a CPU-centric workload or workflow, such as provided with, for example, image rendering, numerical simulation, and deep learning, the thermal management solution for the CPU may be operated at a maximum capacity. With such a workload or workflow, the thermal management solution for the CPU may be hotter than the thermal management solution for the GPU. Heat is transferred from the thermal management solution for the CPU to the thermal management solution for the GPU via the heat pipe until the thermal management solution for the GPU reaches a same temperature as the thermal management solution for the CPU.

For a GPU-centric workload or work flow, such as provided with, for example, graphically intensive games, video conferencing, or a combination thereof, the thermal management solution for the GPU may be operated at a maximum capacity. With such a workload or workflow, the thermal management solution for the GPU may be hotter than the thermal management solution for the CPU. Heat is transferred from the thermal management solution for the GPU to the thermal management solution for the CPU via the heat pipe until the thermal management solution for the CPU reaches a same temperature as the thermal management solution for the GPU.

Due to the linked first thermal management solution and second thermal management solution and the sharing of heat between the first thermal management solution and the second thermal management solution, the thermal management system of the present examples may be designed to handle maximum power dissipation for each of the first component and the second component, with a reduced cost and reduced footprint within the computing device for the thermal management system compared to the prior art. For example, the thermal management system of the prior art with a maximum TDP of 150 W may be reduced in size and cost with the linked first thermal management solution and second thermal management solution of the present examples. The thermal management system of the present examples may have a maximum TDP of, for example, 110 W, while the first thermal management solution is designed to cool, for example, a maximum of 40 W dissipated by the first component, and the second thermal management solution is designed to cool, for example, a maximum of 70 W dissipated by the second component.

In the prior art, the CPU and/or the GPU may include self-protecting throttling mechanisms that keeps the respective component from exceeding a safe temperature limit, as governed by firmware. In order to remain at or below the safe temperature limit, the component automatically reduces frequency at which the component operates. This reduces the operating temperature of the component but also negatively impacts performance. With the linked first thermal management solution and second thermal management solution, when the second component (e.g., the GPU), for example, approaches or reaches the safe temperature limit for the second component, the power for the first component (e.g., the CPU) may be artificially limited so that the second component may be operated at a higher frequency while maintaining or being below the safe temperature limit for the second component. For example, in intense gaming scenarios, the power for the CPU may be limited (e.g., from 20 W to 10 W) when the GPU reaches or approaches the safe temperature limit, and performance of the GPU is improved compared to the prior art. Once the operating temperature of the GPU, for example, has decreased below a threshold, the artificial limit for the CPU may be removed.

The thermal management system designed in this way and controlled in this way provides optimal thermal management for the computing device while minimizing cost and real estate within the computing device for the thermal management system. Shared thermal management may provide improved performance for a component within the computing device during workflows that are that component-centric.

As an example, a computing device includes at least two heat generating electronic components. The at least two heat generating electronic components include a first heat generating electronic component and a second heat generating electronic component. The first heat generating electronic component and the second heat generating electronic component are in thermal communication. The computing device also includes a first sensor operable to measure a first temperature. The first temperature is associated with the first heat generating electronic component. The first heat generating electronic component, the second heat generating electronic component, another heat generating electronic component of the at least two heat generating electronic components, or any combination thereof is configured to compare the first measured temperature to a predetermined temperature, and decrease power for the second heat generating electronic component based on the comparison.

Such heat dissipation apparatuses, systems, and methods have several potential end-uses or applications, including any electronic device having two or more heat generating components. For example, the heat dissipation apparatus, system, or method may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for one or more components within the electronic device. With the improved heat dissipation feature, a more powerful microprocessor may be installed for the electronic device, a thinner electronic device may be designed, a higher processing speed may be provided, the electronic device may be operated at a higher power for a longer period of time, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The computing device 100 includes a housing 104 that supports at least the thermal management system 102 and at least two heat generating components 106 (e.g., a first heat generating component 106a and a second heat generating component 106b). The first heat generating component 106a and the second heat generating component 106b may be any number of electrically powered devices including, for example, a processor, a graphics card, memory (e.g., a double data rate synchronous dynamic random-access memory (DDR SDRAM), a power supply, a hard drive (e.g., a solid state drive (SSD)), RF hardware, a socket, or another electrically powered device. For example, the first heat generating component 106a is a CPU, and the second heat generating component 106b is a GPU. The first heat generating component 106a and the second heat generating component 106b may be supported by the housing 104 via, for example, a printed circuit board (PCB) 108 attached to and/or supported by the housing 104. The CPU 106a and the GPU 106b, for example, are in communication with each other and/or other electrical devices or components of the computing device 100 via the PCB 108. The computing device 100 may include any number of additional components not shown in FIG. 1 (e.g., a hard drive, a power supply, connectors).

The thermal management system 102 includes a first thermal management solution or module 110, a second thermal management solution or module 112, and at least one phase change device 114 (e.g., a first phase change device). The first thermal management module 110 includes one or more thermal management devices. As shown in the example of FIG. 1, the first thermal management module 110 includes a phase change device 116 (e.g., a second phase change device) and one or more heat sinks 118 (e.g., a first heat sink 118a and a second heat sink). The second phase change device 116, at a first end, is physically attached to and/or in thermal communication with the CPU 106a. A second end of the second phase change device 116 is physically attached to and/or in thermal communication with the first heat sink 118a. The first heat sink 118 includes a plurality of fins 120. The plurality of fins 120 may include any number of fins and fins of any number of shapes, sizes, and/or angles relative to each other. The first heat sink 118 and/or the plurality of fins 120 may be sized and/or shaped based on the amount of cooling to be provided by the first thermal management module 110. For example, the plurality of fins 120 form channels 122 that extend in a direction parallel with a direction of air flow provided, for example, by one or more fans of the computing device 100. The plurality of fins 120 may include any number of different types of fins including, for example, pin fins and/or straight fins. The plurality of fins 120 may be made of any number of thermally conductive materials including, for example, copper, aluminum, or titanium.

The first end of the second phase change device 116 may be physically attached to a surface of the first heat generating component 106a via a layer of thermal adhesive. The second end of the second phase change device 116 may be physically attached to the first heat sink 118a in any number of ways including, for example, with an adhesive (e.g., a thermal adhesive), with solder, by a press fit, with one or more connectors (e.g., screws, nut/bolt combinations), or any combination thereof.

The first thermal management module 110 corresponds to the first heat generating component 106a and is in thermal communication with the first heat generating component 106a. The first thermal management module 110 aids in the removal of heat from the first heat generating component 106a. The first thermal management module 110 may include more, fewer, and/or different thermal management devices. For example, the first thermal management module 110 may include a heat spreader and/or a black body that aids in radiative heat transfer. The first thermal management module 110 may include only thermal management devices that are separate or at a distance from the first heat generating component 106a, only thermal management devices that are a part of or adjacent to the first heat generating component 106a, or a combination of thermal management device(s) that are separate or at a distance from the first heat generating component 106a and thermal management device(s) that are a part of or adjacent to the first heat generating component 106a. For example, the first thermal management module 110 may also include the second heat sink (not shown) as part of or physically connected to a surface of the first heat generating component 106a.

The second thermal management module 112 includes one or more thermal management devices. As shown in the example of FIG. 1, the second thermal management module 112 includes one or more heat sinks 124 (e.g., a first heat sink 124a and a second heat sink). The first heat sink 124a includes a plurality of fins 126. The plurality of fins 126 may include any number of fins and fins of any number of shapes, sizes, and/or angles relative to each other. The first heat sink 124a and/or the plurality of fins 126 may be sized and/or shaped based on the amount of cooling to be provided by the second thermal management module 112. For example, the plurality of fins 126 form channels 128 that extend in a direction parallel with a direction of air flow provided, for example, by one or more fans of the computing device 100. The plurality of fins 126 may include any number of different types of fins including, for example, pin fins and/or straight fins. The plurality of fins 126 may be made of any number of thermally conductive materials including, for example, copper, aluminum, or titanium.

The second thermal management module 112 corresponds to the second heat generating component 106b and is in thermal communication with the second heat generating component 106b. The second thermal management module 112 aids in the removal of heat from the second heat generating component 106b. The second thermal management module 112 may include more, fewer, and/or different thermal management devices. For example, the second thermal management module 112 may include a heat spreader, a phase change device, and/or a black body that aids in radiative heat transfer. The second thermal management module 112 may include only thermal management devices that are separate or at a distance from the second heat generating component 106b, only thermal management devices that are a part of or adjacent to the second heat generating component 106b, or a combination of thermal management device(s) that are separate or at a distance from the second heat generating component 106b and thermal management device(s) that are a part of or adjacent to the second heat generating component 106b. For example, the second thermal management module 112 may also include the second heat sink (not shown) as part of or physically connected to a surface of the second heat generating component 106b.

A first end of the first phase change device 114 is in physical contact with and/or are adjacent to the first heat generating component 106a, and a second end of the first phase change device 114 is in physical contact with and/or adjacent to the second heat generating component 106b. In one example, the first end of the first phase change device 114 is physically attached to a surface of the first heat generating component 106a via a layer of thermal adhesive, and the second end of the first phase change device 114 is physically attached to a surface of the second heat generating component 106b via a layer of thermal adhesive. In another example, the first phase change device 114 is thermally connected to the first heat generating component 106a and the second heat generating component 106b via the first thermal management module 110 and the second thermal management module 112, respectively.

The first phase change device 114 is physically attached to the CPU 106a or the first thermal management module 110 and the GPU 106b or the second thermal management module 112 at the first end and the second end of the first phase change device 114, respectively, in any number of ways including, for example, with an adhesive (e.g., a thermal adhesive), with solder, by a press fit, with one or more connectors (e.g., screws, nut/bolt combinations), or any combination thereof. In one example, the first phase change device 114, at least part of the first thermal management module 110, and at least part of the second thermal management module 112 are manufactured as a single component (e.g., 3D printed as a single component). In one example, the computing device 102 does not include the first phase change device 114, and the CPU 106a and the GPU 106b are thermally linked with a piece of hollow or solid thermally conductive material extending between the CPU 106a and the GPU 106b.

The first phase change device 114 extends away from the CPU 106a at the first end of the first phase change device 114 to the GPU 106b at the second end of the first phase change device 114. The first phase change device 114 moves heat away from the CPU 106a and towards the GPU 106b when the CPU 106a is hotter than the GPU 106, and moves heat away from the GPU 106b towards the CPU 106a when the GPU 106b is hotter than the CPU 106a. One or more components of the thermal management system 102 are attached to the housing 104 and/or the PCB 108 in any number of ways including, for example, using one or more connectors (e.g., screws, flanges, tabs).

The first phase change device 114 may be a heat pipe, a vapor chamber, or a combination thereof. The first phase change device 114 may be made of any number of materials including, for example, copper, aluminum, titanium, another thermally conducting material, or any combination thereof. The internal structure of a heat pipe or vapor chamber is important for phase change performance. Features that affect phase change performance include vapor space and capillary features. The vapor space is a path for evaporated working fluid to travel to a condenser, and the capillary features are a pathway for condensed working fluid to return to an evaporator.

The thermal management system 102 may also include one or more fans (not shown) to aid in the removal of heat from the first thermal management module 110 and the second thermal management module 112, respectively. For example, the thermal management system 102 includes a first fan that moves air through the channels 122 formed by the plurality of fins 120 of the first heat sink 118 of the first thermal management module 110, and a second fan that moves air through the channels 128 formed by the plurality of fins 126 of the first heat sink 124 of the second thermal management module 112.

The first heat generating component 106a is in thermal communication with at least part of the first thermal management module 110, and the second heat generating component 106b is in thermal communication with at least part of the second thermal management module 112 in any number of ways including, for example, direct or indirect physical contact, one or more phase change devices (e.g., heat pipes), and/or one or more pieces of thermally conductive material. The first phase change device 114 thermally connects the first heat generating component 106a and the second heat generating component 106b, and thus the first thermal management module 110 and the second thermal management module 112, such that the first thermal management module 110 cools not only the first heat generating component 106a, but also cools the second heat generating component 106b, and vice versa. When one of the first heat generating component 106a and the second heat generating component 106b is hotter than the other of the first heat generating component 106a and the second heat generating component 106b, heat flows from the one heat generating component to the other heat generating component and the corresponding thermal management module via the first phase change device 114. The cooler thermal management module (e.g., the first thermal management module 110) aids the hotter thermal management module (e.g., the second thermal management module 112) in removal of heat from the computing device 100.

Figure 2:
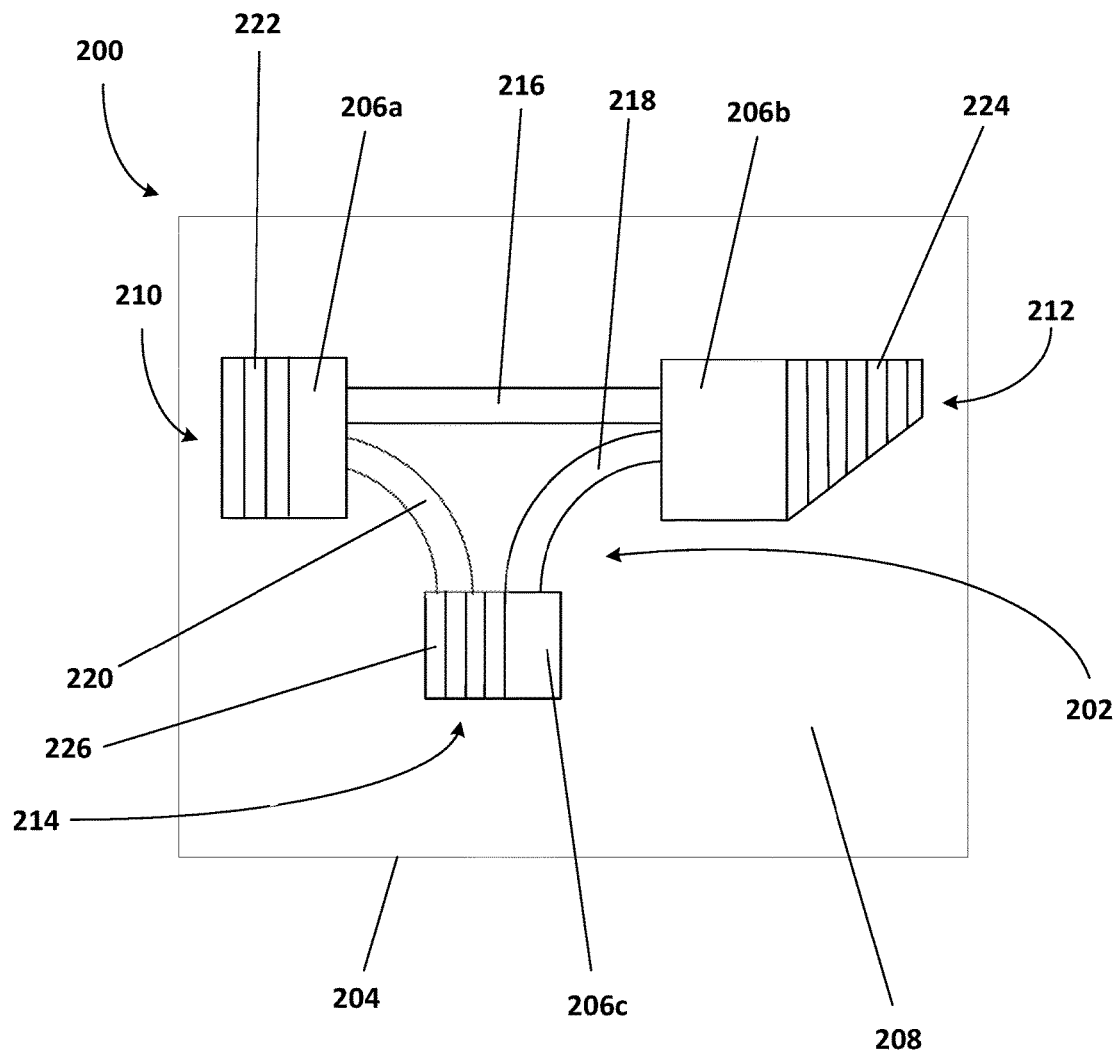
FIG. 2 depicts a top view of a computing device including another example of a shared thermal management system.

In one example, more than two heat generating components are in thermal communication via phase change devices. Accordingly, three or more heat generating components are thermally linked via, for example, phase change devices for shared cooling. FIG. 2 shows a top view of a computing device 200 including an example of a thermal management system 202. The computing device 200 includes a housing 204 that supports at least the thermal management system 202 and at least three heat generating components 206 (e.g., a first heat generating component 206a, a second heat generating component 206b, and a third heat generating component 206c). The first heat generating component 206a, the second heat generating component 206b, and the third heat generating component 206c may be any number of electrically powered devices including, for example, a processor, a graphics card, memory (e.g., DDR SDRAM), a power supply, a hard drive (e.g., SSD), RF hardware, a socket, or another electrically powered device. For example, the first heat generating component 206a is a CPU, the second heat generating component 206b is a GPU, and the third heat generating component 206c is power supply unit (PSU) hardware. The first heat generating component 206a, the second heat generating component 206b, and the third heat generating component 206c may be supported by the housing 204 via, for example, a PCB 208 attached to and/or supported by the housing 204. The CPU 206a, the GPU 206b, and the PSU hardware 206c, for example, are in communication with each other and/or other electrical devices or components of the computing device 200 via the PCB 208. The computing device 200 may include any number of additional components not shown in FIG. 2 (e.g., a hard drive, connectors).

The thermal management system 202 includes a first thermal management solution or module 210, a second thermal management solution or module 212, a third thermal management solution or module 214, a first phase change device 216, a second phase change device 218, and a third phase change device 220. The first thermal management module 210 includes one or more thermal management devices (e.g., one or more heat sinks 222), the second thermal management module 212 includes one or more thermal management devices (e.g., one or more heat sinks 224), and the third thermal management module 214 includes one or more thermal management devices (e.g., one or more heat sinks 226). The first phase change device 216 thermally links the first heat generating component 206a and the second heat generating component 206b, and thus the first thermal management module 210 and the second thermal management module 212; the second phase change device 218 thermally links the second heat generating component 206b and the third heat generating component 206c, and thus the second thermal management module 212 and the third thermal management module 214; the third phase change device 220 thermally links the third heat generating component 206c and the first heat generating component 206a, and thus the third thermal management module 214 and the first thermal management module 210. In one example, the computing device 200 includes fewer than three heat pipes linking the first heat generating component 206a, the second heat generating component 206b, and the third heat generating component 206c, respectively. For example, the thermal management system 202 may not include the third phase change device 220; the first phase change device 216 thermally links the first heat generating component 206a and the second heat generating component 206b, and the second phase change device 218 thermally links the second heat generating component 206b and the third heat generating component 206c. In one example, the computing device 200 includes more than three linked heat generating components. For example, the computing device 200 may include four heat generating components thermally linked with four corresponding phase change devices.

The sharing of the thermal burden generated by two heat generating components (e.g., the first heat generating component 106a and the second heat generating component 106b) allows a more optimized thermal management system to be installed in the computing device. For example, with reference to FIG. 1, instead of the first thermal management module 110 being configured (e.g., sized; number of thermal management devices included in the thermal management module) to cool a maximum of 50 W of dissipated heat and the second thermal management module 112 being configured (e.g., sized; number of thermal management devices included in the thermal management module) to cool a maximum of 100 W of dissipated heat separately, the linked first thermal management module 110 and second thermal management module 112 are configured to cool a smaller TDP (e.g., 110 W instead of 150 W) while still handling the maximum dissipated heat for each component (e.g., 50 W for the first heat generating component 106a and 100 W for the second heat generating component 106b). This provides an optimized thermal management system in terms of cost and footprint within the computing device. The heat generating components may also be controlled when one of the heat generating components (e.g., the GPU 106b) reaches or approaches a corresponding maximum operating temperature, such that the shared cooling provided by the thermal management system allows the GPU 106b, for example, to operate at a higher frequency at the maximum operating temperature compared to the prior art.

Figure 3:
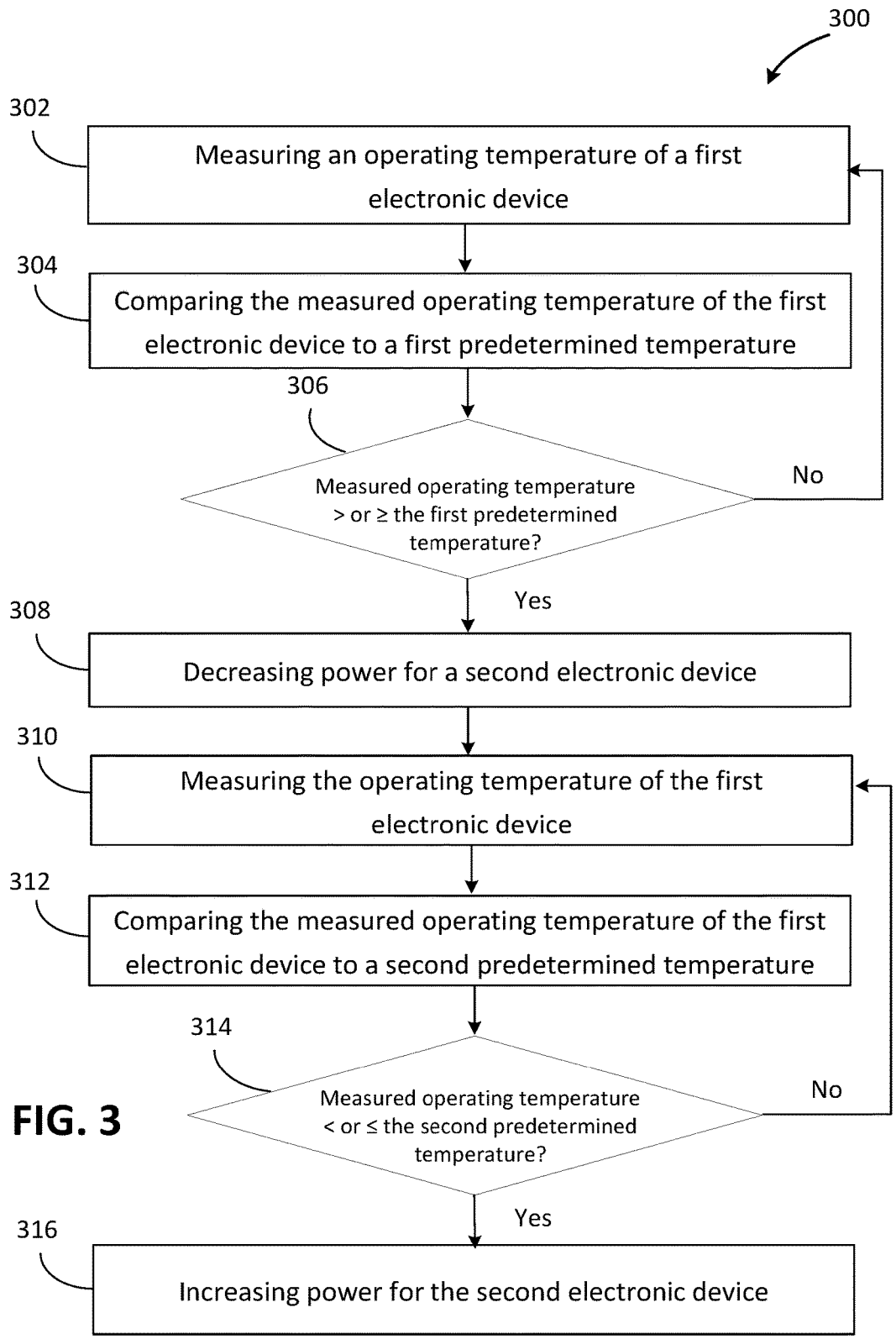
FIG. 3 is a flow diagram of a method for cooling an electronic device in accordance with one example.

FIG. 3 shows a flowchart of one example of a method 300 for cooling an electronic device. The method 300 is implemented in the order shown, but other orders may be used. Additional, different, or fewer acts may be provided. Similar methods may be used for cooling an electronic device.

The computing device may be a computing device shown in FIGS. 1, 2, and/or 4 or may be another computing device. For example, the computing device may include at least two electronic devices (e.g., a first electronic device and a second electronic device). The at least two electronic devices may be mounted within or on a housing of the computing device. The computing device may also include at least two thermal management devices (e.g., a first thermal management device and a second thermal management device) physically and thermally connected to the at least two electronic devices, respectively. The two electronic devices, for example, and thus the two thermal management devices, may be in thermal communication via, for example, a phase change device (e.g., a heat pipe). Each of the two electronic devices may be any number of heat generating electronic components such as, for example, a CPU, a GPU, a PSU, a connector, or another heat generating electronic component. Each of the thermal management devices may include any number of thermal management devices such as, for example, a heat sink with or without fins, one or more phase change devices (e.g., a heat pipe and/or a vapor chamber), a fan, another thermal management device, or any combination thereof. The two electronic devices and thus the two thermal management devices being linked (e.g., in thermal communication) allows both of the thermal management devices to share the cooling burden for the first electronic device and/or the second electronic device.

In act 302, a sensor measures an operating temperature of the first electronic device (e.g., the GPU) of the at least two electronic devices. The first electronic device may include the sensor and/or additional sensors operable to measure junction temperatures, system level temperatures, or a combination thereof (e.g., the operating temperature). In one example, the measured operating temperature is an average of a plurality of measured temperatures. Measuring the operating temperature of the first electronic device may include constantly measuring the operating temperature of the first electronic device or measuring the operating temperature of the first electronic device at an interval.

In act 304, a processor compares the measured operating temperature of the first electronic device to a first predetermined temperature. The first predetermined temperature may be a maximum operating temperature for the first electronic device. In one example, comparing the measured operating temperature of the first electronic device to the first predetermined temperature includes determining whether the measured operating temperature of the first electronic device is greater than or equal to the first predetermined temperature. In another example, the comparing includes the processor calculating a difference between the measured operating temperature of the first electronic device and the first predetermined temperature. In one example, the processor also compares the measured operating temperature of the first electronic device to a threshold temperature. The threshold temperature may be a temperature close to the first predetermined temperature (e.g., 5° F. less than the first predetermined temperature) that indicates the first predetermined temperature is close to being reached.

The processor may be the first electronic device, the second electronic device, another processor within the computing device, another processor outside the computing device, or any combination thereof. In one example, the processor includes a Processor Power Limit 1 (PL1) interface (i.e., PACKAGE_RAPL_LIMITS by) Intel®). The PL1 interface is an architectural knob that may be set to an average power the processor will control itself to. The PL1 may be used for thermal management in any number of other ways (e.g., limiting processor frequency when the first predetermined temperature is approached or reached).

In act 306, if, based on the comparison in act 304, the measured operating temperature is greater than, or greater than or equal to the first predetermined temperature, the method 300 moves to act 308. If, based on the comparison, the measured operating temperature is less than or equal to, or less than the first predetermined temperature, acts 302 and 304 are repeated. In one example, if, based on the comparison of the measured operating temperature of the first electronic device to the threshold temperature in act 304, the measured operating temperature is greater than, or greater than or equal to the threshold temperature, the method 300 moves to act 308.

In act 308, the processor or another processor decreases power for the second electronic device when the measured temperature is greater than or greater than or equal to the first predetermined temperature. For example, the processor may decrease the power from a first power (e.g., 20 W) to a predetermined second power (e.g., 10 W). In another example, the processor gradually decreases the power for the second electronic device based on the operating temperature measured in act 302. For example, if the first predetermined temperature is 85° F. and the predetermined second power is 10 W, the processor may limit the power for the second electronic device between the first power and the predetermined second power based on linear interpolation between a threshold temperature (e.g., 80° F.) and the first predetermined temperature. In other words, the sensor measures the operating temperature of the first electronic device in act 302, and when the measured operating temperature of the first electronic device is greater than or greater than or equal to the threshold temperature, the processor decreases the power for the second electronic device an amount based on how close the measured operating temperature of the first electronic device is to the first predetermined temperature. Acts 302-308 may be repeated until the first predetermined temperature is reached or exceeded. In one example, decreasing the power for the second electronic device may be or include the processor or the other processor sending a signal (e.g., a command) to the second electronic device, instructing the second electronic device to decrease the power for the second electronic device.

In another example, the processor implements a control loop feedback mechanism (e.g., a proportional-integral-derivative (PID) loop) such that the power for the second electronic device is controlled so that the operating temperature of the first electronic device is kept at or just below the first predetermined temperature (e.g., 85° F.) or another temperature and the power for the second electronic device is kept above the predetermined second power (e.g., 10 W). This allows the second electronic device to be operated at a higher power while the first electronic device is still operated at a temperature below the maximum operating temperature.

In act 310, the sensor measures the operating temperature of the first electronic device, and in act 312, the processor compares the measured operating temperature of the first electronic device to a second predetermined temperature.

In act 314, if, based on the comparison in act 312, the measured operating temperature of the first electronic device is greater than, or greater than or equal to the second predetermined temperature, the method 300 moves to act 310. If, based on the comparison, the measured operating temperature of the first electronic device is less than or less than or equal to the second predetermined temperature, the processor or the other processor increases power for the second electronic device in act 316. The power for the second electronic device may be increased to a level at which the second electronic device operated prior to the decrease in act 308 (e.g., 20 W) or a different power.

Acts 302-316 may be performed for other electronic devices within the computing device at the same time or at different times than for the first electronic device, as described above. The example described above may be for a GPU (e.g., the first electronic device) and a CPU (e.g., the second electronic device) during a GPU-centric workflow. The computing device may rapidly change from a GPU-centric workflow to a CPU-centric workflow. The CPU may also include sensors and may continuously or at intervals measure an operating temperature of the CPU (act 302). The CPU or another processor may compare the measured operating temperature of the CPU to a corresponding predetermined temperature (e.g., a maximum operating temperature of the CPU) in parallel with the GPU or another processor comparing the measured operating temperature of the GPU to the first predetermined temperature, and the rest of the method 300 (e.g., acts 306-316) may be performed for the electronic device reaching or exceeding the corresponding maximum operating temperature (e.g., power for the GPU is decreased when the CPU reaches or exceeds the maximum operating temperature for the CPU).

Control for the method may be provided via a hardware embedded controller or a software driver. For a software driver approach, the driver monitors the GPU temperature, for example, and sets the processor PL1 via a processor Model Specific Registers (MSR) or Memory Mapped Registers. For a hardware approach, the embedded controller may monitor the GPU temperature, for example, via a System Management Bus (SMBus) and set the processor PL1 via a Platform Environment Control Interface (PECI).

The method 300 illustrated in FIG. 3 may be implemented for more than two electronic devices of the computing device (e.g., when the thermal management system for shared cooling includes three or more thermally linked thermal management modules for corresponding heat generating components). For example, with a first electronic device, second electronic device, and third electronic device thermally linked via corresponding thermal management modules and heat pipes, power for the second electronic device and power for the third electronic device may be decreased when an operating temperature for the first electronic device approaches or reaches a maximum operating temperature for the first electronic device.

In one example, the method 300 of FIG. 3 may not be implemented when the measured operating temperature of the first electronic device and the measured operating temperature of the second electronic device are both at or close to respective maximum operating temperatures. For example, the method 300 may not be implemented when both the first electronic device and the second electronic device are within 5° F. of the maximum operating temperature of the first electronic device and the maximum operating temperature of the second electronic device, respectively.

The method of FIG. 3, when implemented in a computing device including a shared thermal management solution, as described with reference to FIGS. 1 and 2 above, allows the GPU of the computing device, for example, to reach a higher frequency during a GPU-centric workflow (e.g., during video game play) for a longer period of time, thus improving the gaming experience. By artificially limiting the power for the CPU (e.g., from 20 W to 10 W), for example, during a GPU-centric workflow, the shared thermal management solution better cools the GPU compared to if the CPU was operating at the pre-artificially-limited power.

Figure 4:
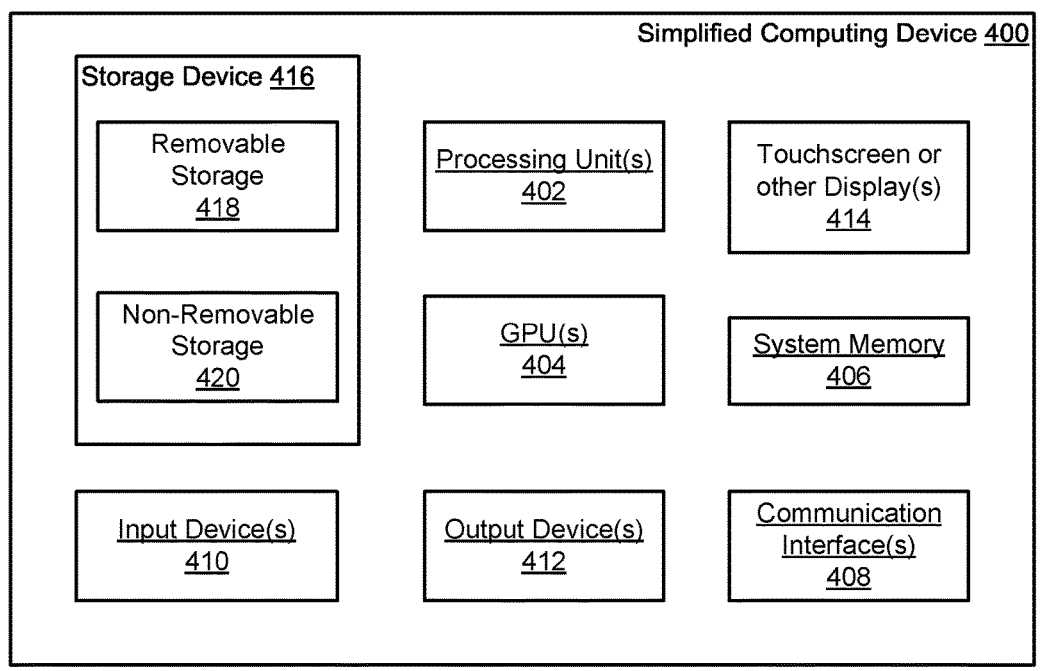
FIG. 4 is a block diagram of a computing environment in accordance with one example for implementation of the disclosed methods or a thermal management system.

With reference to FIG. 4, a thermal management system and/or a method for cooling an electronic device, as described above, may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fans).

The computing environment 400 has sufficient computational capability and system memory to enable basic computational operations. In this example, the computing environment 400 includes one or more processing units 402, which may be individually or collectively referred to herein as a processor. The computing environment 400 may also include one or more graphics processing units (GPUs) 404. The processor 402 and/or the GPU 404 may include integrated memory and/or be in communication with system memory 406. The processor 402 and/or the GPU 404 may be a specialized microprocessor, such as a digital signal processor (DSP), a very long instruction word (VLIW) processor, or other microcontroller, or may be a general purpose central processing unit (CPU) having one or more processing cores. The processor 402, the GPU 404, the system memory 406, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 408. One or more computer input devices 410 (e.g., pointing devices, keyboards, audio input devices, video input devices, haptic input devices, or devices for receiving wired or wireless data transmissions) may be provided. The input devices 410 may include one or more touch-sensitive surfaces, such as track pads. Various output devices 412, including touchscreen or touch-sensitive display(s) 414, may also be provided. The output devices 412 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 416 and includes both volatile and nonvolatile media, whether in removable storage 418 and/or non-removable storage 420. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 400.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes at least two heat generating electronic components. The at least two heat generating electronic components include a first heat generating component and a second heat generating electronic component. The first heat generating electronic component and the second heat generating electronic component are in thermal communication. The computing device also includes a first sensor operable to measure a first temperature. The first temperature is associated with the first heat generating electronic component. The first heat generating electronic component, the second heat generating electronic component, another heat generating electronic component of the at least two heat generating electronic components, or any combination thereof is configured to compare the measured first temperature to a predetermined temperature and decrease power for the second heat generating electronic component based on the comparison.

In a second embodiment, with reference to the first embodiment, the first heat generating electronic component, the second heat generating electronic component, the other heat generating electronic component, or any combination thereof is configured to reduce the power for the second heat generating electronic component when the measured first temperature is greater than the predetermined temperature.

In a third embodiment, with reference to the first embodiment, the first temperature associated with the first heat generating electronic component is an operating temperature of the first heat generating electronic component.

In a fourth embodiment, with reference to the first embodiment, the first heat generating electronic component includes a graphics processing unit, and the second heat generating electronic component includes a central processing unit.

In a fifth embodiment, with reference to the first embodiment, the first heat generating electronic component an the second heat generating electronic component are in thermal communication via a phase change device.

In a sixth embodiment, with reference to the first embodiment, the computing device further includes a first thermal management device and a second thermal management device. The first thermal management device is physically connected to the first heat generating electronic component, and the second thermal management device is physically connected to the second heat generating electronic component.

In a seventh embodiment, with reference to the sixth embodiment, the first thermal management device includes a first heat sink, a first phase change device, or the first heat sink and the first phase change device. The second thermal management device includes a second heat sink, a second phase change device, or the second heat sink and the second phase change device.

In an eighth embodiment, with reference to the first embodiment, the computing device further includes a second sensor operable to measure a second temperature. The second temperature is associated with the second heat generating electronic component. The predetermined temperature is a first predetermined temperature. The first heat generating electronic component, the second heat generating electronic component, the other heat generating electronic component, or any combination thereof is configured to compare the measured second temperature to a second predetermined temperature and reduce power for the first heat generating electronic component when the measured second temperature is greater than the second predetermined temperature, or is greater than or equal to the second predetermined temperature.

In a ninth embodiment, with reference to the first embodiment, the first sensor is operable to continuously measure the temperature associated with the first heat generating electronic component, is operable to measure the temperature associated with the first heat generating electronic component at a predetermined interval, or a combination thereof. The predetermined temperature is a first predetermined temperature. After power for the second heat generating electronic component is reduced, the first heat generating electronic component, the second heat generating electronic component, the other heat generating electronic component, or any combination thereof is configured to compare the measured first temperature with a second predetermined temperature and increase the power for the second heat generating electronic component when the measured first temperature is less than the second predetermined temperature, or is less than or equal to the second predetermined temperature.

In a tenth embodiment, a method for cooling at least two electronic devices is provided. At least two thermal management devices physically connected to the at least two electronic devices, respectively, are in thermal communication with each other. The method includes measuring, by a sensor, an operating temperature of a first electronic device of the at least two electronic devices. The method also includes comparing, by a processor, the measured operating temperature of the first electronic device to a predetermined temperature. The method includes decreasing power for a second electronic device of the at least two electronic devices when the measured temperature is greater than or greater than or equal to the predetermined temperature.

In an eleventh embodiment, with reference to the tenth embodiment, measuring the operating temperature of the first electronic device includes constantly measuring the operating temperature of the first electronic device or measuring the operating temperature of the first electronic device at an interval. The predetermined temperature is a first predetermined temperature. The method further includes, after the power for the second electronic device is decreased, repeating the measuring of the operating temperature of the first electronic device and the comparing of the measured operating temperature of the first electronic device to the predetermined temperature. The method also includes increasing the power for the second electronic device when the measured operating temperature of the first electronic device is less than or less than or equal to a second predetermined temperature.

In a twelfth embodiment, with reference to the tenth embodiment, decreasing the power for the second electronic device includes decreasing the power for the second electronic device from a first power to a second power when the measured temperature is greater than or greater than or equal to the predetermined temperature.

In a thirteenth embodiment, with reference to the tenth embodiment, the method further includes calculating a difference between the measured operating temperature of the first electronic device and the predetermined temperature. Decreasing the power for the second electronic device includes decreasing the power for the second electronic device based on the calculated difference between the measured operating temperature of the first electronic device and the predetermined temperature.

In a fourteenth embodiment, with reference to the tenth embodiment, the method further includes repeating the measuring, the comparing, and the decreasing until the measured temperature is less than or less than or equal to the predetermined temperature.

In a fifteenth embodiment, with reference to the tenth embodiment, the sensor is a first sensor, and the predetermined temperature is a first predetermined temperature. The method further includes measuring, by a second sensor, an operating temperature of the second electronic device. The method also includes comparing, by the processor, the measured operating temperature of the second electronic device to a second predetermined temperature. The method includes decreasing power for the first electronic device based on the comparison of the measured operating temperature of the first electronic device to the first predetermined temperature and the comparison of the measured operating temperature of the second electronic device to the second predetermined temperature.

In a sixteenth embodiment, a thermal management system includes a first thermal management device physically connected to a first heat generating component. The thermal management system also includes a second thermal management device physically connected to a second heat generating component. The thermal management system includes a phase change device thermally connecting the first thermal management device and the second thermal management device. The thermal management system includes a sensor operable to measure an operating temperature of the first heat generating component, and a processor. The processor is configured to compare the measured operating temperature of the first heat generating component to a predetermined temperature. The processor is also configured to decrease power for the second heat generating component when the measured operating temperature of the first heat generating component is greater than or greater than or equal to the predetermined temperature.

In a seventeenth embodiment, with reference to the sixteenth embodiment, the processor is the first heat generating component, the second heat generating component, or the first heat generating component and the second heat generating component.

In an eighteenth embodiment, with reference to the sixteenth embodiment, the phase change device is a first phase change device. The thermal management system further includes a third thermal management device physically connected to a third heat generating component, and a second phase change device thermally connecting the second thermal management device and the third thermal management device.

In a nineteenth embodiment, with reference to the eighteenth embodiment, the processor is further configured to decrease power for the third heat generating component when the measured operating temperature of the first heat generating component is greater than or greater than or equal to the predetermined temperature.

In a twentieth embodiment, with reference to the sixteenth embodiment, the phase change device includes a heat pipe, a vapor chamber, or the heat pipe and the vapor chamber.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:
at least two heat generating electronic components, the at least two heat generating electronic components comprising a first heat generating electronic component and a second heat generating electronic component, the first heat generating electronic component and the second heat generating electronic component being in thermal communication via a heat pipe or a vapor chamber, a first end of the heat pipe or the vapor chamber being in physical contact with or adjacent to the first heat generating electronic component and a second end of the heat pipe or the vapor chamber being in physical contact with or adjacent to the second heat generating electronic component; and
a first sensor operable to measure a first temperature, the first temperature being an operating temperature of the first heat generating electronic component;
a second sensor operable to measure a second temperature, the second temperature being associated with the second heat generating component;
wherein the first heat generating electronic component, the second heat generating electronic component, another heat generating electronic component of the at least two heat generating electronic components, or any combination thereof is configured to:
compare the measured first temperature to a first predetermined temperature;
compare the measured second temperature to a second predetermined temperature; and
decrease power for the second heat generating electronic component based on the comparison of the measured first temperature to the first predetermined temperature unless the measured second temperature is greater than or equal to the second predetermined temperature.

2. The computing device of claim 1, wherein the first heat generating electronic component, the second heat generating electronic component, the other heat generating electronic component, or any combination thereof is configured to reduce the power for the second heat generating electronic component when the measured first temperature is greater than the predetermined temperature.

3. The computing device of claim 1, wherein the first heat generating electronic component comprises a graphics processing unit, and the second heat generating electronic component comprises a central processing unit.

4. The computing device of claim 1, further comprising a first thermal management device and a second thermal management device, the first thermal management device being physically connected to the first heat generating electronic component and the second thermal management device being physically connected to the second heat generating electronic component.

5. The computing device of claim 4, wherein the first thermal management device comprises a first heat sink, a first phase change device, or the first heat sink and the first phase change device, and
wherein the second thermal management device comprises a second heat sink, a second phase change device, or the second heat sink and the second phase change device.

6. The computing device of claim 1,
wherein the first heat generating electronic component, the second heat generating electronic component the other heat generating electronic component, or any combination thereof is configured to:
reduce power for the first heat generating electronic component when the measured second temperature is greater than or equal to the second predetermined temperature.

7. The computing device of claim 1, wherein the first sensor is operable to continuously measure the temperature associated with the first heat generating electronic component, is operable to measure the temperature associated with the first heat generating electronic component at a predetermined interval, or a combination thereof,
wherein after power for the second heat generating electronic component is reduced, the first heat generating electronic component, the second heat generating electronic component, the other heat generating electronic component, or any combination thereof is configured to:
compare the measured first temperature with a third predetermined temperature; and
increase the power for the second heat generating electronic component when the measured first temperature is less than the third predetermined temperature, or is less than or equal to the third predetermined temperature.

8. A method for cooling at least two electronic devices, at least two thermal management devices physically connected to the at least two electronic devices, respectively, being in thermal communication with each other via a heat pipe or a vapor chamber, a first end of the heat pipe or the vapor chamber being in physical contact with or adjacent to a first electronic device of the at least two electronic devices and a second end of the heat pipe or the vapor chamber being in physical contact with or adjacent to a second electronic device of the at least two electronic devices, the method comprising:
measuring, by a first sensor, an operating temperature of the first electronic device;
comparing, by a processor, the measured operating temperature of the first electronic device to a first predetermined temperature;
measuring, by a second sensor, a temperature associated with the second electronic device;
comparing, by the processor, the measured temperature associated with the second electronic device to a second predetermined temperature; and
decreasing, by the processor, power for the second electronic device based on the comparison of the measured operating temperature of the first electronic device to the first predetermined temperature unless the measured temperature associated with the second electronic device is greater than or equal to the second predetermined temperature.

9. The method of claim 8, wherein measuring the operating temperature of the first electronic device comprises constantly measuring the operating temperature of the first electronic device or measuring the operating temperature of the first electronic device at an interval,
and
wherein the method further comprises:
after the power for the second electronic device is decreased, repeating the measuring of the operating temperature of the first electronic device and the comparing of the measured operating temperature of the first electronic device to the first predetermined temperature; and
increasing the power for the second electronic device when the measured operating temperature of the first electronic device is less than or less than or equal to a third predetermined temperature.

10. The method of claim 8, wherein decreasing the power for the second electronic device comprises decreasing the power for the second electronic device from a first power to a second power when the measured operating temperature of the first
electronic device is greater than or equal to the first predetermined temperature.

11. The method of claim 8, wherein the method further comprises calculating a difference between the measured operating temperature of the first electronic device and the predetermined temperature, and
wherein decreasing the power for the second electronic device comprises decreasing the power for the second electronic device based on the calculated difference between the measured operating temperature of the first electronic device and the predetermined temperature.

12. The method of claim 8, further comprising repeating the measuring, the comparing, and the decreasing until the measured temperature is less than or less than or equal to the predetermined temperature.

13. The method of claim 8, wherein the sensor is a first sensor, and the predetermined temperature is a first predetermined temperature, and wherein the method further comprises:
measuring, by a second sensor, an operating temperature of the second electronic device;
comparing, by the processor, the measured operating temperature of the second electronic device to a second predetermined temperature; and
decreasing power for the first electronic device based on the comparison of the measured operating temperature of the first electronic device to the first predetermined temperature and the comparison of the measured operating temperature of the second electronic device to the second predetermined temperature.

14. A thermal management system comprising:
a first thermal management device physically connected to a first heat generating component;
a second thermal management device physically connected to a second heat generating component;
a phase change device thermally connecting the first thermal management device and the second thermal management device, a first end of the phase change device being in physical contact with or adjacent to the first heat generating component and a second end of the phase change device being in physical contact with or adjacent to the second heat generating component;
a first sensor operable to measure an operating temperature of the first heat generating component
a second sensor operable to measure an operating temperature of the second heat generating component; and
a processor configured to:
compare the measured operating temperature of the first heat generating component to a first predetermined temperature;
compare the measured operating temperature of the second heat generating component to the second predetermined temperature; and
decrease power for the second heat generating component based on the comparison of the measured operating temperature of the first heat generating component to the first predetermined temperature unless the measured operating temperature of the second heat generating component is greater than or equal to the second predetermined temperature.

15. The thermal management system of claim 14, wherein the processor is the first heat generating component, the second heat generating component, or the first heat generating component and the second heat generating component.

16. The thermal management system of claim 14, wherein the phase change device comprises a heat pipe, a vapor chamber, or the heat pipe and the vapor chamber.

17. The thermal management system of claim 14, wherein the phase change device is a first phase change device, and
wherein the thermal management system further comprises:
a third thermal management device physically connected to a third heat generating component; and
a second phase change device thermally connecting the second thermal management device and the third thermal management device.

18. The thermal management system of claim 17, wherein the processor is further configured to decrease power for the third heat generating component when the measured operating temperature of the first heat generating component is greater than or equal to the predetermined temperature.

* * * * *